(12) United States Patent
Cochran et al.

(10) Patent No.: US 7,228,484 B2
(45) Date of Patent: Jun. 5, 2007

(54) METHOD AND APPARATUS FOR IMPLEMENTING REDUNDANCY ENHANCED DIFFERENTIAL SIGNAL INTERFACE

(75) Inventors: William Hugh Cochran, Rochester, MN (US); William Paul Hovis, Rochester, MN (US); Randall Scott Jensen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 10/660,032

(22) Filed: Sep. 11, 2003

(65) Prior Publication Data

US 2005/0060629 A1     Mar. 17, 2005

(51) Int. Cl.
*H03M 13/00*     (2006.01)

(52) U.S. Cl. ..................................... 714/758

(58) Field of Classification Search .................. 326/9, 326/14; 370/242

See application file for complete search history.

(56) References Cited

U.S. PATENT DOCUMENTS 6,034,995 A *  3/2000 Eisele et al. ................ 375/257
6,601,123 B1 * 7/2003 Zhang et al. ............... 710/305
2004/0252644 A1* 12/2004 Constantinescu ........... 370/242

OTHER PUBLICATIONS

Fred Schraff, Choosing differential or single-endeed measurements for data acqisition system. Sensor Magazine Online-Dec. 1997.*

* cited by examiner

*Primary Examiner*—Albert Decady
*Assistant Examiner*—Sam Rizk
(74) *Attorney, Agent, or Firm*—Joan Pennington

(57) ABSTRACT

A method and apparatus are provided for implementing a redundancy enhanced differential signal interface. A differential signaling I/O pair is coupled to a differential receiver interface. The differential receiver interface includes a pair of multiplexers coupled to a differential receiver. An error detecting mechanism is coupled to the differential receiver for detecting an error. When an error is detected, an interface operating speed is reduced. True and complement sides of a differential signaling I/O pair are alternately tested by first enabling a multiplexer control of one of the multiplexers, reading data, and checking for the error; then enabling a multiplexer control of the other multiplexer, reading data, and checking for the error. Responsive to detecting a failure of a true side or a complement side, the detected failed true side or complement side is set to a reference voltage and the reduced interface operating speed is maintained for continued operation.

13 Claims, 3 Drawing Sheets

100

| STATE | "TRUE" CONNECTION | "COMPLEMENT" CONNECTION | BUS SPEED |
|---|---|---|---|
| NORMAL | A | $\overline{A}$ | FULL |
| A FAILS | VREF OR VDD/2 | $\overline{A}$ | DEGRADED SPEED |
| A "BAR" FAILS | A | VREF OR VDD/2 | DEGRADED SPEED |
| A & A "BAR" FAIL | DON'T CARE (A) | DON'T CARE (A "BAR") | NEED ECC TO REPAIR |

FIG. 2

METHOD AND APPARATUS FOR IMPLEMENTING REDUNDANCY ENHANCED DIFFERENTIAL SIGNAL INTERFACE

FIELD OF THE INVENTION

The present invention relates generally to the data processing field, and more particularly, relates to a method and apparatus for implementing a redundancy enhanced differential signal interface.

DESCRIPTION OF THE RELATED ART

The reliability of electrical interfaces that cross mechanical connector boundaries are subject to the reliability of the mechanical connector. In addition, electrical failures occur due to defective drivers, receivers, and device pin attach problems, and any other electrical path failure, such as open or shorted net, via or cable wires.

One traditional approach is to use a redundant connection that can be used to replace one of a group of connections. In the event that one connection of the group fails, such as opens, shorts or becomes high enough impedance, then the redundant connection is used.

Another approach has been to include critical network connections in an Error Correction Code (ECC) Word so that a failure could be detected using the ECC word and corrected if within the scope of the ECC capability.

As bandwidth continues to increase the sensitivity of the driver and receiver circuits to impedance discontinuities also increases. A common solution is to convert signals from single ended to differential. Differential signals have significant electrical advantage over single ended signals. The down side of differential signaling is that each signal requires twice the number of connections or number of wires of a single ended signal.

SUMMARY OF THE INVENTION

A principal object of the present invention is to provide a method and apparatus for implementing a redundancy enhanced differential signal interface. Other important objects of the present invention are to provide such method and apparatus for implementing a redundancy enhanced differential signal interface substantially without negative effect and that overcome many of the disadvantages of prior art arrangements.

In brief, a method and apparatus are provided for implementing a redundancy enhanced differential signal interface. When an error is detected, an interface operating speed is reduced. True and complement sides of a differential signaling I/O pair are alternately tested. Responsive to detecting a failure of a true side or a complement side, the detected failed true side or complement side is set to a reference voltage and the reduced interface operating speed is maintained for continued operation.

A differential signaling I/O pair is coupled to a differential receiver interface. The differential receiver interface includes a pair of multiplexers coupled to a differential receiver. Each multiplexer has a first input receiving a respective true or complement signal and a second input connected to a voltage reference and a multiplexer control input. Each multiplexer provides a respective true or complement output signal to the differential receiver. An error detecting mechanism is coupled to the differential receiver for detecting an error. Test and failure control logic is coupled to the ECC and differential receiver interface. The test and failure control logic is responsive to a detected error for reducing an interface operating speed, and for alternately enabling the multiplexer control input of each of the pair of multiplexers for testing of true and complement sides of the differential signaling I/O pair. The test and failure control logic is responsive to a detected failure of a true side or a complement side, for setting the detected failed true side or complement side to a reference voltage for continued operation.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 is a diagram illustrating state of the apparatus for implementing a redundancy enhanced differential signal interface of FIG. 1 in accordance with the preferred embodiment.

DETAILED DESCRIPTION OF THE PREFERRED EMBODIMENTS

Figure 1:
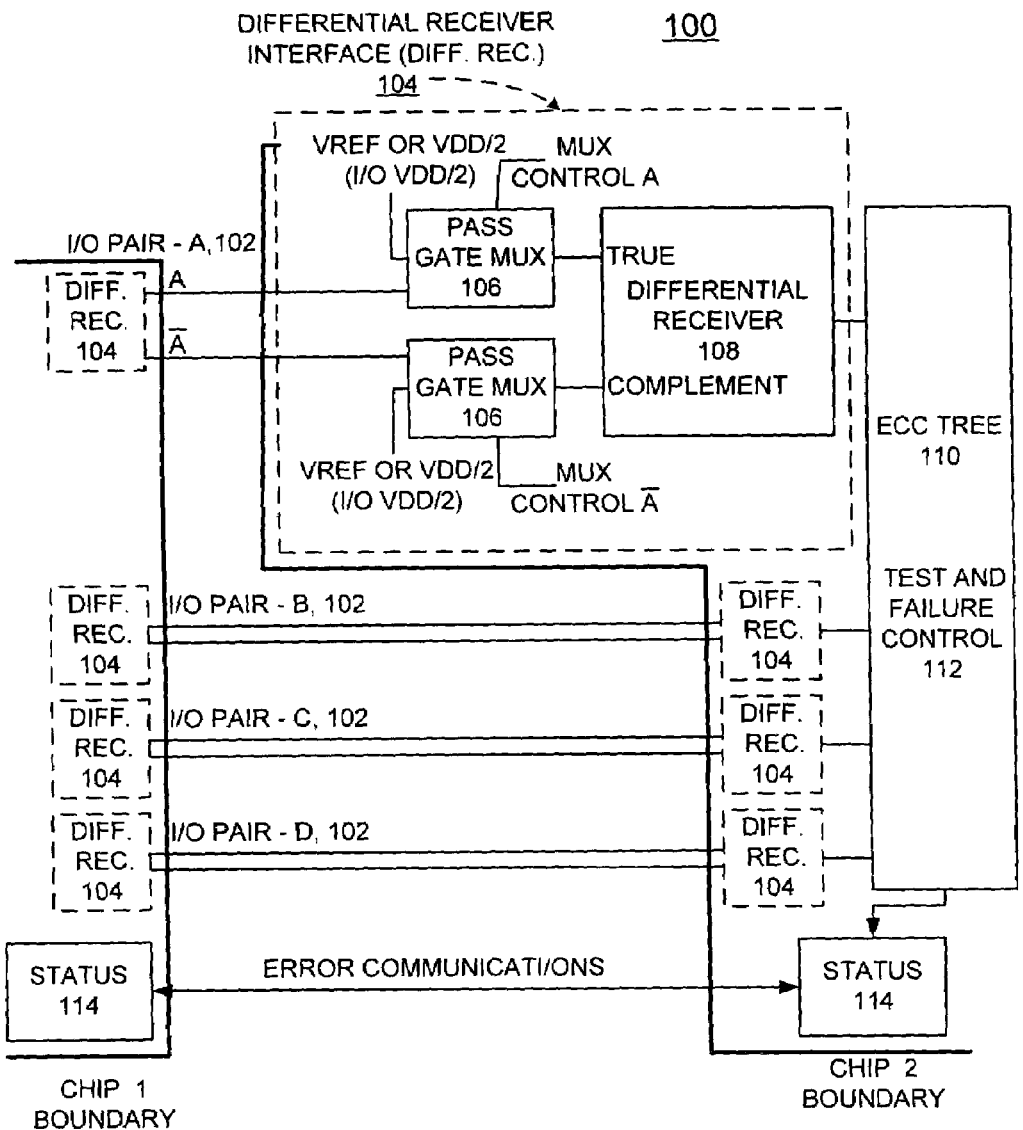
FIG. 1 is a schematic diagram representation illustrating exemplary apparatus for implementing a redundancy enhanced differential signal interface in accordance with the preferred embodiment.

Referring now to the drawings, in FIG. 1 there is shown exemplary system generally designated by the reference character 100 for implementing a redundancy enhanced differential signal interface in accordance with the preferred embodiment. The illustrated redundancy enhanced differential signal interface system 100 includes a plurality of input/output (I/O) pairs 102, respectively labeled I/O PAIR-A, I/O PAIR-B, I/O PAIR-C, and I/O PAIR-D extending between a chip 1 boundary and a chip 2 boundary. Each I/O pair A, B, C, and D, 102 includes a true and complement signal, typically both signals operating as a normal differential pair. In normal operation, both sides of the differential signal are switching. While a boundary of four I/O is shown, it should be understood that the number of I/O that the present invention supports is not limited.

In accordance with features of the preferred embodiment, differential signaling is used to provide a redundancy function by changing to a single connection of one I/O pair 102 to provide redundant operation. Correctly operating differential signals are always driven to opposite values. Differential signals only occur at the same value when switching from 1 to 0 and 0 to 1 for a very brief point where the differential signals cross. In general, a receiving device captures a signal bit by using both true and complement values in a differential receiver. Differential signaling helps provide higher speed operation as noise affects tend to happen on both signals and gain is a function of difference between the true and complement signals. Some implementations may choose to terminate the signals and some may not. However, a common approach is to terminate the true signals to the complement signal near or at the receiving device.

It should be understood the present invention is not limited to the illustrated interface system 100 and can be applied generally to other differential signaling arrangements, for example, within a single chip.

A differential receiver interface (DIFF. REC.) 104 of the preferred embodiment includes a pair of pass gate multiplexers 106 and a differential receiver 108. Each multiplexer 106 includes a first input connected to a respective true or complement signal and a second input having an applied voltage reference, VREF, such as VDD/2 or I/O VDD/2. Each multiplexer 106 includes a multiplexer control input for selecting between the first and second inputs of the multiplexer and an output connected to the differential receiver 108. A respective output of the multiplexers 106 is applied to a respective true and complement signal input of the differential receiver 108. As shown, each I/O pair A, B, C, and D includes a respective differential receiver interface or DIFF. REC.104 at the boundary of chip 1 and chip 2, for example, for bidirectional I/O pair operation. An Error Correction Code (ECC) tree 110 for detecting and correcting signal errors and a test and failure control 112 are coupled to each differential receiver 108 of the differential receiver interfaces 104. A status function 114 is included within the first and second chips 1, 2 and connected by a separate link labeled ERROR COMMUNICATIONS.

In accordance with features of the preferred embodiment, when one side of a differential I/O pair 102 fails, for example, open or high impendence circuit, the system 100 continues to run with differential pair having the failed link operating in single ended mode. When an error is detected, the interface clock is reduced, for example, to ½ speed or other reduced speed, allowing the interface to continue operating until a repair can be performed. This provides the redundant capability for each individual data bit on the interface where differential signaling is used, although with some degree of degraded performance. Also the capability to tolerate a large number of fails while continuing to operate is enabled, as long as two fails do not occur on a single I/O pair 102.

In accordance with features of the preferred embodiment, the redundancy enhanced method of the preferred embodiment implemented with the differential receiver interface 104 can substantially reduce the occurrences of unscheduled repair actions (URAs), although some performance degradation may occur. Deferred repair actions (RA's) can be used to restore performance, if deemed necessary. The operational redundancy self healing enabled by the differential receiver interface 104 can be used in conjunction with other error correcting techniques, such as parity, retry, ECC, checksum, and redundancy techniques to provide an even more robust system.

Referring now to FIG. 2, there is shown operating states of the apparatus 100 for implementing a redundancy enhanced differential signal interface of FIG. 1 in accordance with the preferred embodiment. During a normal state, the true or A signal of I/O pair A, 102 is applied to the true connection and the complement or A bar signal is applied to the complement connection of differential receiver 108 with full bus speed. When the true or A signal of I/O pair A, 102 fails, then the voltage reference VREF or VDD/2 is applied to the true connection of differential receiver 108 by activating the multiplexer control A of the pass gate multiplexer 106 receiving the true or A signal of I/O pair A, 102 and the complement or A bar signal is applied to the complement connection of differential receiver 108 with bus speed reduced from normal. When the complement or A bar signal of I/O pair A, 102 fails, then the voltage reference VREF or VDD/2 is applied to the complement connection of differential receiver 108 by activating the multiplexer control A bar of the pass gate multiplexer 106 receiving the complement or A bar signal of I/O pair A, 102 and the true or A signal is applied to the true connection of differential receiver 108 with bus speed reduced from normal. When both the true or A signal of I/O pair A, 102 and the complement or A bar signal of I/O pair A, 102 fails, no changes are made and operations continue relying on error correction.

Figure 3:
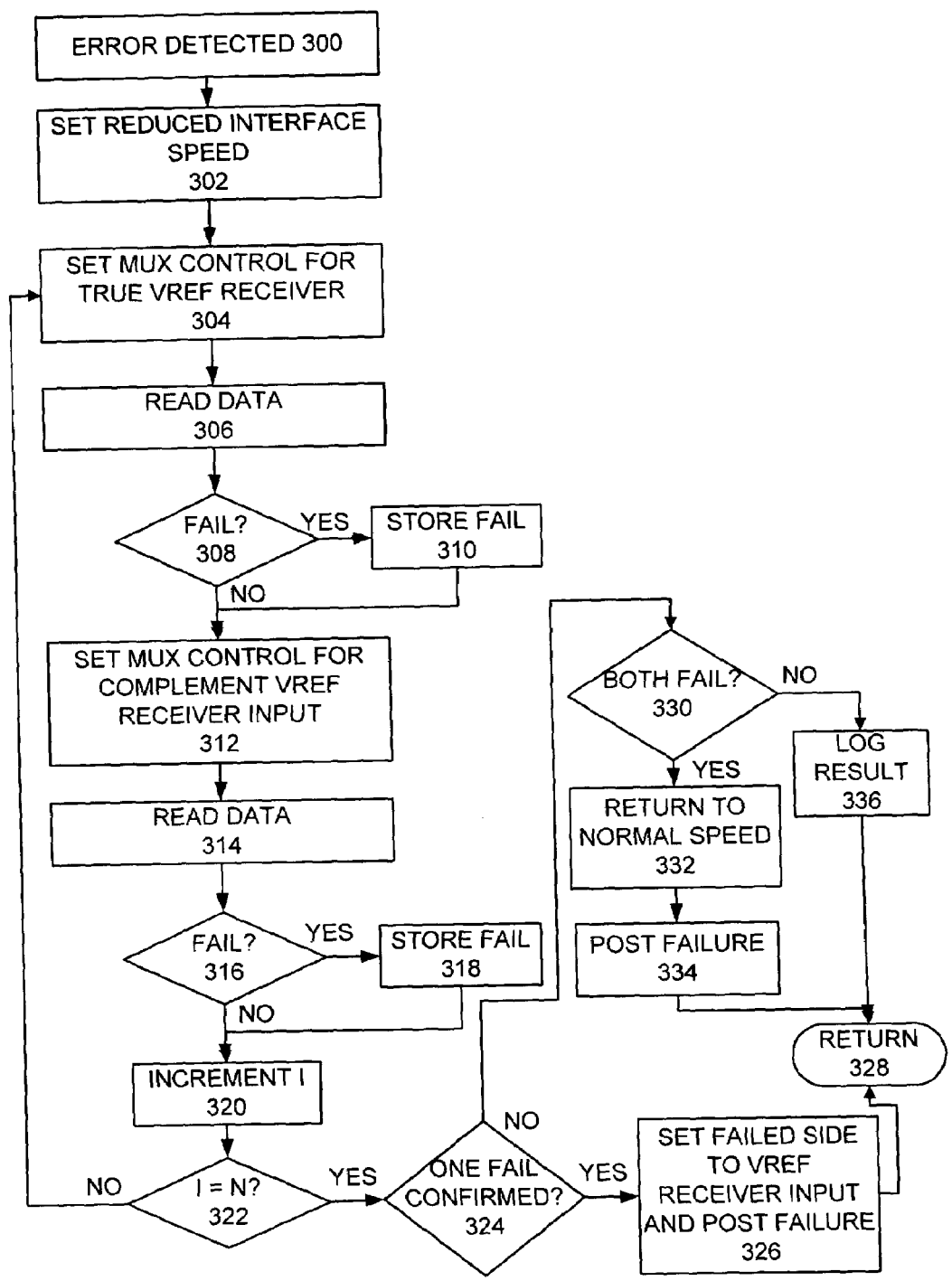
FIG. 3 is a logical flow diagram illustrating exemplary operational steps for implementing a redundancy enhanced differential signal interface of apparatus of FIG. 1 in accordance with the preferred embodiment.

Referring to FIG. 3, there are shown exemplary operational steps of the enhanced differential signal interface system 100 in accordance with the preferred embodiment. For any signal of I/O pairs A, B, C, and D, 102, a failure of the connection in the true or complement line eventually causes a signal to be detected as bad by the ECC tree 110, or using other conventional ECC schemes, parity schemes, or comparators for true not equal to complement detection. Once an error is detected as indicated in a block 300, then to determine which connection, true or complement, is bad, a reduced interface speed is set as indicated in a block 302. Error analysis techniques can be used to detect an error at block 300 rather than a single bit error. When switching to a slower operating speed, it may be necessary to shift or delay the capture clock to the latches after the receivers 108 as well. Then the receiving differential receiver interface 104 test the true and complement lines by forcing alternately each side of the faulty bit receiver to a reference voltage VREF, for example, a mid-point DC voltage half-way between a high and low value.

As indicated in a block 304, the multiplexer control is set for the multiplexer 106 that normally applies the true signal to apply the VREF to the true input of differential receiver 108. When forcing true side to the voltage reference, data at the lower speed are read as indicated in a block 306 to see if correct data, that is, no errors over a period of time or no errors with a predefined pattern, is captured as indicated in a decision block 308.

If incorrect data or failure is identified, then the fail is stored as indicated in a block 310. Then the multiplexer control is set for the multiplexer 106 that normally applies the complement signal to apply the VREF to the complement input of differential receiver 108. The data are read as indicated in a block 314 and checked as indicated in a decision block 316. Then if incorrect data or failure is identified, then the fail is stored as indicated in a block 318.

Various criteria can be established to determine when a line passes and when it fails, and would include items such as: Successful (no ECC errors) and valid reads (data is being used) of both ones and zeros have occurred. Reads have occurred successfully (no ECC errors) with 0 to 1 and 1 to 0 transitions (as opposed to just a long burst of 0's and later a long burst of 1's), or a test pattern is run to guarantee the interface now works. Errors occur under the opposite setting only for one or all of the criteria above (detected errors). Either real time system data or test patterns can be used.

It should be understood that the implementation of this invention is dependant on a particular application. This means that a repair can occur on a first error, or depending on the method of error analysis being applied, repair may be delayed until an error threshold is reached.

The alternate testing of the true and complement sides optionally is repeated by incrementing I as indicated in a block 320 and checking whether I equal N as indicated in a decision block 320, where I is initially zero and N is a selected number N of 1 or greater. Then after alternately testing the true and complement sides for the selected number N of one or more times, checking for one fail being confirmed is performed, as indicated in a decision block 324.

Once a failure is confirmed at decision block 324, the differential receiver 108 of the receiving differential receiver interface 104 is set to always tie off the failing side to the reference value VREF and the failure is posted or logged as indicated in a block 326 with operation continuing at the slower speed, either permanently or until a repair can be made at some later time. The receiving differential receiver interface 104 optionally can log such an event and post results to chip registers or service processor function for the appropriate operating system responses. Then the sequential operations return as indicated in a block 328.

It should also be noted that any differential bit of other I/O pairs A, B, C, and D, 102 that fails can now also be repaired using the same process. The reduced interface speed has already been set at block 302 for the first failure, and is not changed again for any later failures. Operation continues at the slower speed, either permanently or until needed repairs are made.

Otherwise, when not one but both sides fail as indicated in a decision block 330, then the problem may not be related to the differential bus and no change is appropriate. Both failures on the bus may not be due to problems with the drivers, receivers, connections, or wires. The bus is returned to normal or high speed operation as indicated in a block 332 and the failure is posted as indicated in a block 334. Then the sequential operations return at block 328. Other system actions can be taken if necessary to address the failing situation, such as in a memory data bus to steer in a new DRAM device or array where a DRAM problem has been determined to be the cause of the failure, or simply continue to correct the failing bits with ECC 110.

Otherwise if both sides pass as indicated in a decision block 330 after having tested each side one at a time at the reduced interface speed, but having failed when running fast at the normal high interface speed, this may indicate that the problem is not with the interface, but that the speed change caused the failure to go away. If the failure goes away when operating slowly, the appropriate action is to leave the receiver 108 in differential mode and continue to operate at slower speed. Then the sequential operations return at block 328 to process any future fails on the interface by method of the preferred embodiment as described above. Diagnosis and isolation of the speed effect on the failure would have to be addressed by other fault isolation techniques upstream or downstream from the differential bus.

The differential bus provided by I/O pairs 102 is either unidirectional with one side always driving and one side always receiving, or bidirectional with each side alternately driving and receiving. In the case of a unidirectional differential bus, performing the method of the preferred embodiment, such as illustrated in FIG. 3 on the receiving end of the bus is sufficient to address failures. For a bidirectional bus, the method typically would be performed for receivers on both ends of the I/O pairs 102 because most fail mechanisms will cause the interface to fail in both directions. This means when receiving data the receiver side must perform the method of the preferred embodiment. When the bus direction changes the other receiver must also perform the same method, while this can be done independently from the other receiver. Both sides of the bus must respond at the same time to the request to run at half or reduced speed, and retain the knowledge that they are running at reduced speed.

While the present invention has been described with reference to the details of the embodiments of the invention shown in the drawing, these details are not intended to limit the scope of the invention as claimed in the appended claims.

What is claimed is:

1. A method for implementing a redundancy enhanced differential signal interface comprising the steps of:
   providing a differential signaling input/output (I/O) pair connected to a differential receiver interface;
   detecting an error from said differential receiver interface;
   responsive to said detected error, reducing an interface operating speed of said differential receiver interface;
   alternately testing of true and complement sides of said differential signaling I/O pair; and
   responsive to detecting a failure of a true side or a complement side, setting the detected failed true side or complement side to a reference voltage and maintaining said reduced interface operating speed of said differential receiver interface.

2. A method for implementing a redundancy enhanced differential signal interface as recited in claim 1 wherein the step of detecting said error includes the step of utilizing Error Correction Code (ECC) for error detecting.

3. A method for implementing a redundancy enhanced differential signal interface as recited in claim 1 wherein the step of reducing said interface operating speed includes the step of setting an interface operating speed to about one half of normal operating speed.

4. A method for implementing a redundancy enhanced differential signal interface as recited in claim 1 wherein the step of alternately testing true and complement sides of a differential signaling I/O pair includes the steps of providing a pair of multiplexers coupled to a differential receiver, each multiplexer receiving a respective true or complement signal first input and a voltage reference second input; and each multiplexer providing a respective true or complement output signal to said differential receiver.

5. A method for implementing a redundancy enhanced differential signal interface as recited in claim 4 includes the steps of enabling a multiplexer control for one of said pair of multiplexers; reading data; and checking for the error; and enabling a multiplexer control for the other one of said pair of multiplexers; reading data; and checking for the error.

6. A method for implementing a redundancy enhanced differential signal interface as recited in claim 1 further includes the steps responsive to detecting a failure of both said true side and said complement side, returning to normal operating speed and posting said failure.

7. A method for implementing a redundancy enhanced differential signal interface as recited in claim 1 further includes the steps responsive to detecting no failure of either a true side or a complement side, posting said detected no failure, and continuing operation at said reduced interface operating speed.

8. Apparatus for implementing a redundancy enhanced differential signal interface comprising:
   a differential signaling input/output (I/O) pair;
   a differential receiver interface coupled to said differential signaling I/O pair; said differential receiver interface including a pair of multiplexers coupled to a differential receiver, each multiplexer having a first input receiving a respective true or complement signal and a second input connected to a voltage reference and a multiplexer control input; and each multiplexer providing a respective true or complement output signal to said differential receiver;
   error detecting means coupled to said differential receiver interface for detecting an error;
   test and failure control logic coupled to said error detecting means and said differential receiver interface; said test and failure control logic being responsive to a detected error, for reducing an interface operating speed; and alternately enabling said multiplexer control input of said pair of multiplexers for testing of true and complement sides of said differential signaling I/O pair; and responsive to detecting a failure of a true side or a complement side, for setting the detected failed true side or complement side of said differential receiver to a reference voltage for continued; and said test and failure control logic maintaining said reduced interface operating speed for continued operation after setting the detected failed true side or complement side to a reference voltage.

9. Apparatus for implementing a redundancy enhanced differential signal interface as recited in claim 8 wherein said test and failure control logic is responsive to detecting a failure of both said true side and said complement side, for returning to normal operating speed and for posting said detected failure of both said true side and said complement side.

10. Apparatus for implementing a redundancy enhanced differential signal interface as recited in claim 8 wherein said test and failure control logic is responsive to detecting no failure of either said true side and said complement side, for posting said no failure, and for maintaining said reduced interface operating speed for continued operation.

11. Apparatus for implementing a redundancy enhanced differential signal interface as recited in claim 8 wherein said reduced interface operating speed is about one half of normal operating speed.

12. Apparatus for implementing a redundancy enhanced differential signal interface as recited in claim 8 wherein said voltage reference is a middle level voltage between a high and low level of said differential signals.

13. Apparatus for implementing a redundancy enhanced differential signal interface as recited in claim 8 wherein said test and failure control logic tests true and complement sides of said differential signaling I/O pair includes-enabling said multiplexer control for one of said pair of multiplexers; reading data; and checking for the error; and enabling said multiplexer control for the other one of said pair of multiplexers; reading data; and checking for the error.

* * * * *